(12) United States Patent
Sung et al.

(10) Patent No.: US 8,397,379 B2
(45) Date of Patent: Mar. 19, 2013

(54) METHOD FOR FABRICATING CERAMIC SUBSTRATE

(75) Inventors: Je Hong Sung, Gyunggi-do (KR); Yoon Hyuck Choi, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 73 days.

(21) Appl. No.: 13/017,950

(22) Filed: Jan. 31, 2011

(65) Prior Publication Data

US 2012/0047730 A1 Mar. 1, 2012

(30) Foreign Application Priority Data

Aug. 26, 2010 (KR) .................. 10-2010-0082971

(51) Int. Cl.
*H05K 3/36* (2006.01)

(52) U.S. Cl. ............... 29/830; 29/832; 29/840; 29/846; 29/852

(58) Field of Classification Search ............ 29/830, 29/832, 840, 846, 852
See application file for complete search history.

(56) References Cited

U.S. PATENT DOCUMENTS 5,472,539 A * 12/1995 Saia et al. ............... 156/155
6,088,492 A * 7/2000 Kaneko et al. .......... 385/14
2008/0248614 A1 * 10/2008 Yang et al. ............... 438/118

FOREIGN PATENT DOCUMENTS

| JP | 2000-006363 | | 1/2000 |
| JP | 2005181638 A | * | 7/2005 |
| KR | 10-2008-0093594 A | | 10/2008 |

OTHER PUBLICATIONS

Korean Office Action, w/ English translation thereof, issued in Korean Patent Application No. 10-2010-0082971 dated Sep. 26, 2011.

* cited by examiner

*Primary Examiner* — Carl Arbes
(74) *Attorney, Agent, or Firm* — McDermott Will & Emery LLP

(57) ABSTRACT

A method for fabricating a ceramic substrate includes: preparing a ceramic substrate; disposing a metal mask having a plurality of holes at an upper side of the ceramic substrate; and injecting a polyimide resin into the holes of the metal mask to form a polyimide thin film on the ceramic substrate. A thin film is formed on a ceramic substrate in a simpler manner, so the fabrication cost can be reduced and a fixed time can be shortened, thus increasing the efficiency of a product.

14 Claims, 3 Drawing Sheets

METHOD FOR FABRICATING CERAMIC SUBSTRATE

CROSS-REFERENCE TO RELATED APPLICATIONS

This application claims the priority of Korean Patent Application No. 10-2010-0082971 filed on Aug. 26, 2010, in the Korean Intellectual Property Office, the disclosure of which is incorporated herein by reference.

BACKGROUND OF THE INVENTION

1. Field of the Invention

The present invention relates to a method for fabricating a ceramic substrate and, more particularly, to a method for forming a polyimide thin film on a large-scale, weighty ceramic substrate through a simple method.

2. Description of the Related Art

Recently, as electronic components continue to be reduced in size and smaller electronic components tend to be increasingly preferred, compact modules and substrates have been developed by making electronic components more precise, patterns finer, and films thinner. However, when a commonly used printed circuit board (PCB) is employed for a small electronic component, drawbacks are recognized in that the PCB needs to be reduced in size, a signal loss occurs in a radio frequency area, and reliability is degraded in conditions of high temperature and high moisture.

Thus, in order to overcome such shortcomings, a substrate using a ceramic is in use. When a main ingredient of a ceramic substrate is a ceramic composition including a large amount of glass available for low temperature cofiring, the substrate is classified as a low temperature cofired ceramic (LTCC) substrate.

The LTCC substrate can be fabricated according to various methods. The LTCC substrate fabrication methods may be classified into a shrinkage method and a non-shrinkage method depending on whether or not the substrate is shrunken when fired. The LTCC substrate is advantageous in that it has excellent thermal and electrical characteristics, has high structural degree of freedom, and can be easily converged (or amalgamated) and compounded with different techniques.

In forming a single or multiple polyimide surface layers on the LTCC substrate, a surface layer formation material is coated by using a spin-coating method. However, due to the trend of an increase in the size of a semiconductor wafer and a ceramic substrate, the spin-coating method is not suitable for forming a uniform film of a weighty, large-scale substrate through a high speed rotation.

SUMMARY OF THE INVENTION

An aspect of the present invention provides a method for forming a single or multiple polyimide surface layers of a ceramic substrate through a simpler process, and a method for fabricating a ceramic substrate using the same.

According to an aspect of the present invention, there is provided a method for fabricating a ceramic substrate, including: preparing a ceramic substrate; disposing a metal mask having a plurality of holes at an upper side of the ceramic substrate; and injecting a polyimide resin into the holes of the metal mask to form a polyimide thin film on the ceramic substrate.

In forming the polyimide layer, the polyimide resin may be applied to the ceramic substrate and leveled to form a polyimide film.

The method may further include: polarizing the polyimide film through a mechanical method, a chemical method, or a mechanical and a chemical method.

The polyimide resin may be injected in the form of a dot on the ceramic substrate.

The thickness of the polyimide film may be adjusted by adjusting the size of the holes formed in the metal mask.

The size (e.g., diameter) of each of the holes of the metal mask may be 30 μm or larger.

The thickness of the polyimide film may be adjusted by adjusting the interval between the holes formed in the metal mask.

The interval between the holes formed in the metal mask ranges from 30 μm to 500 μm.

The area of the holes formed in the metal mask may be 80% or less of the entire area of the metal mask.

The polyimide resin may have viscosity ranging from $10^3$ cps to $10^5$ cps.

The metal mask may be formed of a metal, such as nickel (Ni) or silver (Ag), having a low reactivity.

The thickness of the polyimide thin film formed on the ceramic substrate may range from 5 μm to 100 μm.

The method may further include: forming a via hole in the polyimide thin film, after forming the polyimide thin film.

The method may further include: forming an electrode pad on the via hole, after forming the via hole.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
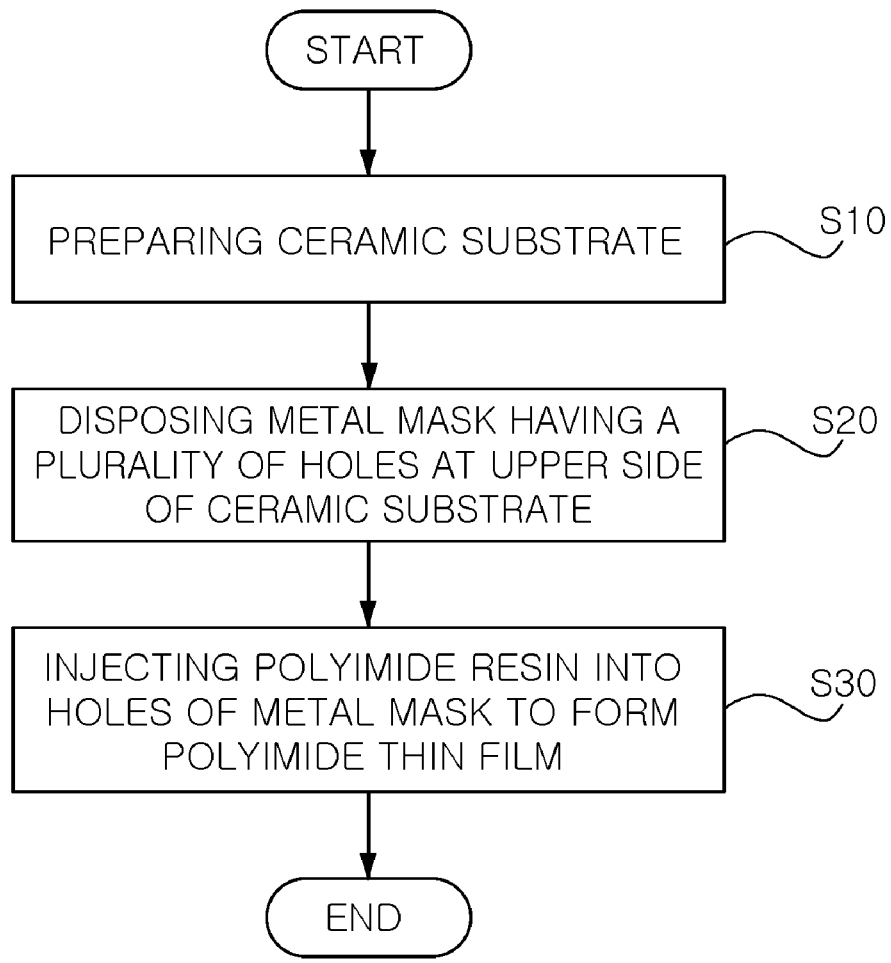
FIG. 1 is a flow chart illustrating the process of a method for forming a thin film on a ceramic substrate according to an exemplary embodiment of the present invention.
Figure 2:
FIG. 2 is a view showing a step of preparing the ceramic substrate according to an exemplary embodiment of the present invention.

Exemplary embodiments of the present invention will now be described in detail with reference to the accompanying drawings. The invention may however be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a flow chart illustrating the process of a method for forming a thin film on a ceramic substrate according to an exemplary embodiment of the present invention.

The method for forming a thin film on a ceramic substrate according to an exemplary embodiment of the present invention includes a step (S10) of preparing a ceramic substrate, a step (S20) of disposing a metal mask having a plurality of holes at an upper side of the ceramic substrate; and a step (S30) of injecting a polyimide resin into the holes of the metal mask to form a polyimide thin film on the ceramic substrate.

The method may further include leveling the injected polyimide resin.

According to a different exemplary embodiment, the method may further include hardening the polyimide resin after the polyimide resin is injected, and may further include performing mechanical and/or chemical planarization in order to control the level of flatness (smoothness or planarity) of the polyimide thin film.

The method may further include removing a portion of the polyimide thin film to form a via hole after the polyimide thin film is formed on the ceramic substrate, and may further include forming an electrode pad on the via hole.

According to an exemplary embodiment of the present invention, a polyimide (PI) resin is printed on the ceramic substrate by using a screen printing method. In the related art, because a screen reacts with the polyimide resin, a screen printing method cannot be applied.

However, in an exemplary embodiment of the present invention, because a metal mask, instead of a screen, is used, it does not react with the polyimide resin, so the screen printing method can be employed. Thus, the polyimide thin film can be formed in a simpler manner.

According to an exemplary embodiment of the present invention, the metal mask may be made of a metal such as nickel (Ni) and/or silver (Ag) having a low reactivity with the polyimide resin, but the present invention is not limited thereto.

The thickness of the polyimide thin film formed on the ceramic substrate can be adjusted by adjusting the size of the holes of the metal mask and the interval between the holes of the metal mask.

In FIG. 1, a low temperature cofired ceramic (LTCC) substrate fabricated through a shrinkage process or a non-shrinkage process is prepared (step S10). The LTCC substrate includes a printed circuit pattern (not shown) centered on a ceramic laminated body 100.

According to an exemplary embodiment of the present invention, in order to form a thin film of a ceramic substrate, the LTCC substrate is prepared (step S10).

The LTCC substrate may be fabricated according to various methods. The methods for fabricating an LTCC substrate may be classified into a shrinkage method and a non-shrinkage method, depending on whether or not the substrate is shrunk when fired. Namely, the LTCC substrate is fired at 600° C. to 900° C., and in general, the ceramic shows approximately a 14% shrinkage rate in the temperature range of 600° C. to 900° C. Thus, a method for fabricating the substrate by making it shrunk when fired is a shrinkage method and a method for firing the substrate such that the ceramic is not shrunk through a certain method is the non-shrinkage method.

In the non-shrinkage method, in order to prevent the substrate from being shrunk, a constraining layer may be formed on both sides of the substrate with the printed circuit pattern formed therein and fired. In this case, the constraining layer may be made of a material which is not shrunk at the temperature at which the substrate is fired, but can be easily controlled in shrinkage.

Figure 3A:
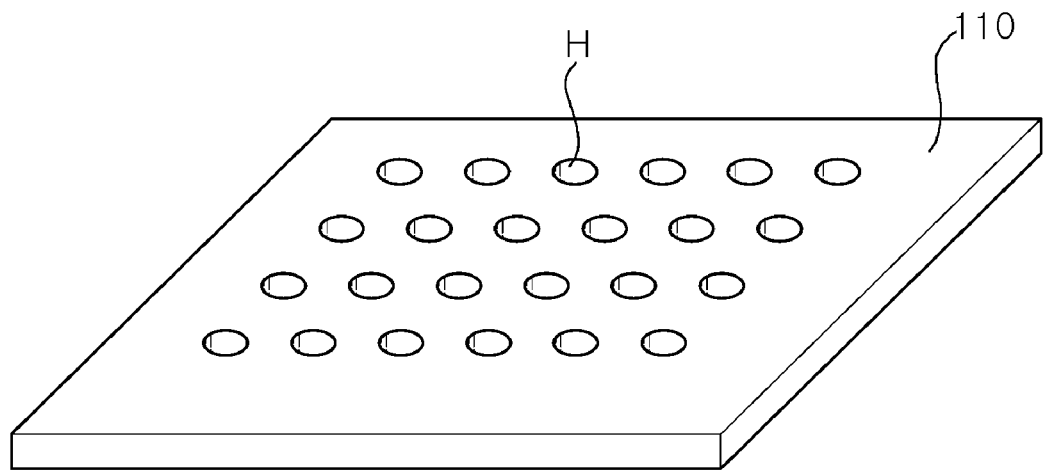
FIG. 3A is a perspective view of a metal mask according to an exemplary embodiment of the present invention.
Figure 3B:
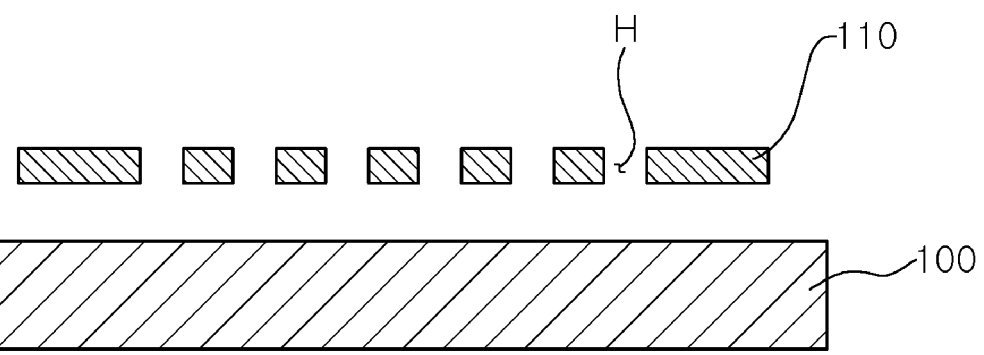
FIG. 3B is a view showing a step of disposing a metal mask on the ceramic substrate according to an exemplary embodiment of the present invention.

FIG. 3A is a perspective view of the metal mask formed on the ceramic substrate, and FIG. 3B is a view showing a step (S20) of preparing the metal mask on the ceramic substrate according to an exemplary embodiment of the present invention.

With reference to FIG. 3A, a plurality of holes (H) are formed on the metal mask formed on the ceramic substrate 100, and the thickness of the polyimide thin film can be adjusted by regulating the size of the holes and the interval between the holes.

If the size of the holes of the metal mask is too large, the polyimide may be formed to be too thick, and if the size of the holes of the metal mask is too small, the polyimide resin would possibly not be injected thereinto. Thus, the size of the holes of the metal mask may be 30 μm or larger, but the present invention is not limited thereto.

If the size of the holes of the metal mask is too small, the polyimide thin film may be formed to be too thick, and if the interval between the holes of the metal mask is too large, it would be different to form a thin film on the ceramic substrate. Thus, the space between the holes of the metal mask may be 30 μm to 500 μm, but the present invention is not limited thereto.

According to an exemplary embodiment of the present invention, in order to form a polyimide layer having a thickness of 5 μm to 100 μm, the thickness of the metal mask may range from 30 μm to 2 μm and the area of the holes formed in the metal mask may be 80% of the entirety of the metal mask, but the present invention is not limited thereto.

With reference to FIG. 3B, the metal mask 110 is disposed at an upper side of the ceramic substrate 100. The polyimide resin in the form of a liquid is injected onto the ceramic substrate 100 through the holes of the metal mask 110 by using a squeezer, or the like.

Unlike the screen used in the existing screen printing method, the metal mask 110 is made of a metal, so a reaction of the metal mask with the polyimide resin can be prevented.

In the present exemplary embodiment, polyimide is used as the thin film formation material, but the screen printing method using the metal mask can be employed in order to form a different thin film that can be formed on the ceramic substrate.

In addition, the size of the holes (H) of the metal mask may be adjusted according to the viscosity of each thin film formation material.

If the viscosity of the polyimide resin is too low, the polyimide resin might not be able to pass through the holes of the metal mask so as to be injected, and if the viscosity of the polyimide resin is too high, it may be difficult to inject a certain amount of the polyimide resin into the metal mask. According to an exemplary embodiment of the present invention, the polyimide resin may be adjusted to have viscosity ranging from $10^3$ cps to $10^5$ cps, but the present invention is not limited thereto.

In addition, the amount of the thin film formation material that passes through the metal mask can be adjusted by regulating the size of the holes (H), and accordingly, the thickness of the thin film formed on the ceramic substrate can be adjusted.

Figure 4:
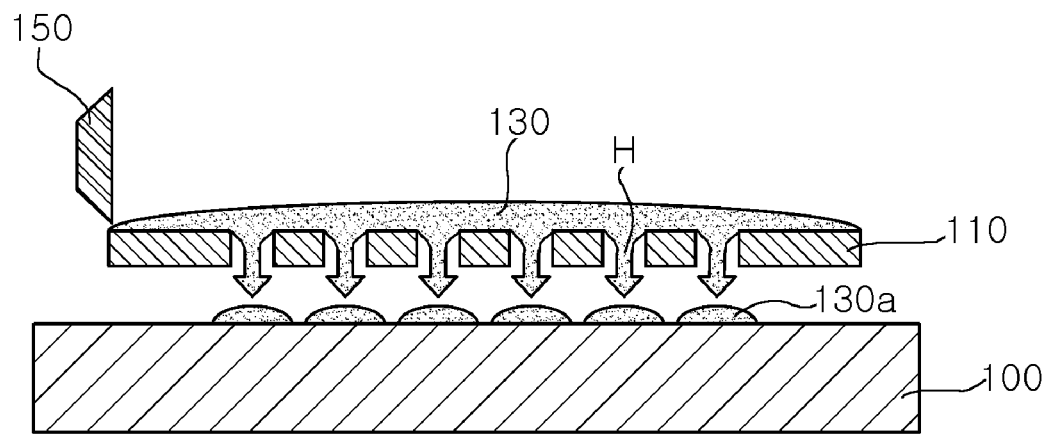
FIG. 4 is a view showing a step of injecting a polyimide resin into the metal mask according to an exemplary embodiment of the present invention.

FIG. 4 is a view showing a step of injecting the polyimide resin into the metal mask according to an exemplary embodiment of the present invention.

According to an exemplary embodiment of the present invention, the material such as the polyimide resin in the form of a liquid 130 can be formed in the form of dots 130a on the ceramic substrate, and a polyimide thin film can be formed on the ceramic substrate by using natural spreading or by using a leveling phenomenon.

In addition, in a different exemplary embodiment, in order to planarize the polyimide thin film, a mechanical and/or chemical planarization process may be additionally performed.

Figure 5:
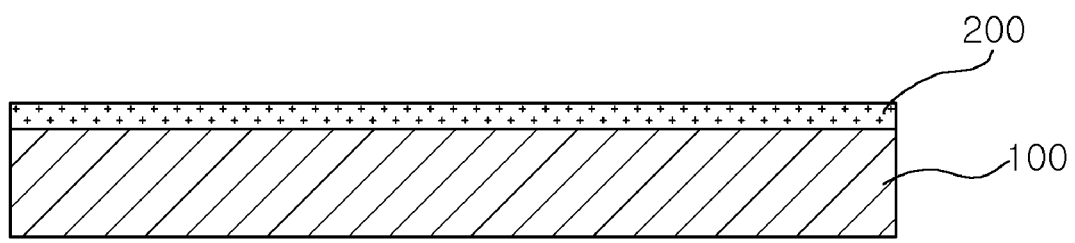
FIG. 5 is a view showing a polyimide thin film formed according to an exemplary embodiment of the present invention.

FIG. 5 is a sectional view of the ceramic substrate 100 with the polyimide thin film 200 formed thereon according to an exemplary embodiment of the present invention.

The polyimide thin film 200, having an excellent heat resistance and excellent chemical stability, is formed on the ceramic substrate 100 according to the foregoing method.

According to an exemplary embodiment of the present invention, a step of forming a via hole in the polyimide thin film may be additionally performed after the polyimide thin film 200 is formed, in order to fabricate the ceramic substrate.

Also, an electrode pad may be formed on the via hole in order to fabricate a ceramic substrate having a desired pattern.

In the present exemplary embodiment, because the screen printing method using the metal mask is employed, the polyimide thin film can be formed on a large-scale substrate and/or weighty substrate in a simpler manner.

In addition, because high-priced spin coating equipment is not required, the fabrication cost of the ceramic substrate can be reduced.

In addition, the thickness of the polyimide thin film 200 can be adjusted by simply regulating the size of the holes (H) of the metal mask 110.

Thus, because the thin film of the ceramic substrate is fabricated in a simpler manner, the ceramic substrate can be fabricated to have a high reliability at a low fabrication cost.

As set forth above, according to exemplary embodiments of the invention, a thin film of a ceramic substrate can be formed through a simpler process. Thus, a fabrication cost can be reduced and a fabrication time can be shortened.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for fabricating a ceramic substrate, the method comprising steps of:
   preparing a ceramic substrate;
   preparing a metal mask having a plurality of holes;
   disposing the metal mask at an upper side of the ceramic substrate;
   injecting a polyimide resin through the plurality of holes of the metal mask onto the ceramic substrate; and
   forming a polyimide thin film on the ceramic substrate with the injected polyimide resin.

2. The method of claim 1, wherein the polyimide resin is injected through the holes of the metal mask so as to be formed in the form of dots on the ceramic substrate.

3. The method of claim 1, wherein, the step of forming the polyimide thin film includes the step of:
   applying the polyimide resin to the ceramic substrate and leveling the polyimide resin to form the polyimide thin film.

4. The method of claim 1, further comprising the step of:
   polarizing the polyimide thin film through a mechanical method, a chemical method, or a mechanical and a chemical method.

5. The method of claim 1, further comprising the step of:
   adjusting the diameter of the holes of the metal mask to adjust the thickness of the polyimide thin film.

6. The method of claim 5, wherein the diameter of each of the holes of the metal mask is 30 μm or larger.

7. The method of claim 1, further comprising the step of:
   adjusting the interval between the holes of the metal mask to adjust the thickness of the polyimide thin film.

8. The method of claim 7, wherein the interval between the holes formed in the metal mask ranges from 30 μm to 500 μm.

9. The method of claim 5, wherein the area of the holes of the metal mask is 80% or less of the entire area of the metal mask.

10. The method of claim 1, wherein the polyimide resin has viscosity ranging from $10^3$ cps to $10^5$ cps.

11. The method of claim 1, wherein the metal mask is formed of one or more of nickel (Ni) and silver (Ag).

12. The method of claim 1, wherein the thickness of the polyimide thin film formed on the ceramic substrate ranges from 5 μm to 100 μm.

13. The method of claim 1, further comprising the step of:
   forming a via hole in the polyimide thin film, after forming the polyimide thin film.

14. The method of claim 13, further comprising the step of:
   forming an electrode pad on the via hole, after forming the via hole.

* * * * *